(12) United States Patent
Zhang et al.

(10) Patent No.: US 12,206,007 B2
(45) Date of Patent: Jan. 21, 2025

(54) SEMICONDUCTOR DEVICE AND METHOD FOR FABRICATING THE SAME

(71) Applicant: UNITED MICROELECTRONICS CORP., Hsin-Chu (TW)

(72) Inventors: Wen-Wen Zhang, Changhua County (TW); Kun-Chen Ho, Tainan (TW); Chun-Lung Chen, Tainan (TW); Chung-Yi Chiu, Tainan (TW); Ming-Chou Lu, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 203 days.

(21) Appl. No.: 17/868,753

(22) Filed: Jul. 19, 2022

(65) Prior Publication Data

US 2023/0411489 A1    Dec. 21, 2023

(30) Foreign Application Priority Data

Jun. 17, 2022   (TW) .................................. 111122678

(51) Int. Cl.
| | | |
|---|---|---|
| *H01L 29/49* | (2006.01) | |
| *H01L 29/40* | (2006.01) | |
| *H01L 29/417* | (2006.01) | |
| *H01L 29/66* | (2006.01) | |
| *H01L 29/78* | (2006.01) | |

(52) U.S. Cl.
CPC ........ *H01L 29/4991* (2013.01); *H01L 29/401* (2013.01); *H01L 29/41775* (2013.01); *H01L 29/66492* (2013.01); *H01L 29/7833* (2013.01)

(58) Field of Classification Search
CPC .............. H01L 29/4991; H01L 29/401; H01L 29/41775; H01L 29/66492; H01L 29/7833; H01L 21/76814; H01L 2221/1063; H01L 21/31111; H01L 21/31155; H01L 21/76826; H01L 21/2236; H01L 21/76825; H01L 21/76828; H01L 21/7682; H01L 29/66575
See application file for complete search history.

(56) References Cited

U.S. PATENT DOCUMENTS

| | | | |
|---|---|---|---|
| 6,492,245 B1 | 12/2002 | Liu et al. | |
| 7,994,046 B2 | 8/2011 | Jeng | |
| 2020/0127110 A1* | 4/2020 | Lee | ..................... H01L 21/7682 |
| 2021/0249519 A1* | 8/2021 | Yao | ................... H01L 29/66795 |
| 2022/0310820 A1* | 9/2022 | Huang | ............. H01L 29/66795 |
| 2023/0275094 A1* | 8/2023 | Lee | ................... H01L 29/66795 |
| | | | 257/288 |

* cited by examiner

*Primary Examiner* — Mohammad A Rahman
(74) *Attorney, Agent, or Firm* — Winston Hsu

(57) ABSTRACT

A method for fabricating a semiconductor device includes the steps of forming a gate structure on a substrate, forming an interlayer dielectric (ILD) layer on the gate structure, forming a contact hole in the ILD layer adjacent to the gate structure, performing a plasma doping process to form a doped layer in the ILD layer and a source/drain region adjacent to the gate structure, forming a conductive layer in the contact hole, planarizing the conductive layer to form a contact plug, removing the doped layer to form an air gap adjacent to the contact plug, and then forming a stop layer on the ILD layer and the contact plug.

5 Claims, 3 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of forming air gap around contact plugs.

2. Description of the Prior Art

As device dimensions continue to shrink, a reduction in interconnect line widths leads to increased line resistance (R) for signals. Further, reduced spacing between conducting lines creates more parasitic capacitance (C). The result is an increase in RC signal delay, which slows chip speed and lowers chip performance.

The line capacitance, C, is directly proportional to the dielectric constant, or k-value of a dielectric material. A low-k dielectric reduces the total interconnect capacitance of the chip, reduces the RC signal delay, and improves chip performance. Lowering the total capacitance also decreases power consumption. The use of a low-k dielectric material in conjunction with a low-resistance metal line provides an interconnect system with optimum performance for the VLSI technology. For this reason, prior art attempts to reduce the RC delays have focused on utilizing material with a low-k to fill the gaps between the metal lines.

Silicon dioxide ($SiO_2$) has been conventionally preferred as a dielectric material even though it has a relatively high dielectric constant (relative to vacuum) of about 4.1 to 4.5 because it is a thermally and chemically stable material and conventional oxide etching techniques are available for high-aspect-ratio contacts and via holes. However, as device dimensions decrease and the packing density increases, it is necessary to reduce the spacing between conductive lines to effectively wire up the integrated circuits. Therefore, a large number of lower dielectric constant materials are currently being investigated to reduce the RC value of the chip further. These include among many others fluorinated $SiO_2$, aerogels, and polymers. Another method being proposed to lower the dielectric constant even further is to form air gaps between the interconnect lines. While silicon dioxide has a dielectric constant of about 4 and greater, the dielectric constant of air is about 1.

Although air is the best dielectric material for lowering the RC value, unfortunately the use of air gap structures in integrated circuit fabrication has been hindered with problems. Overall mechanical strength of the device is reduced correspondingly and lead to structural deformation and a weakened structure can have serious effect in various aspects of subsequent integrated circuit fabrication. Accordingly, what is needed in the art is an air gap interconnect structure and method of manufacture thereof that addresses the above-discussed issues.

SUMMARY OF THE INVENTION

A method for fabricating a semiconductor device includes the steps of forming a gate structure on a substrate, forming an interlayer dielectric (ILD) layer on the gate structure, forming a contact hole in the ILD layer adjacent to the gate structure, performing a plasma doping process to form a doped layer in the ILD layer and a source/drain region adjacent to the gate structure, forming a conductive layer in the contact hole, planarizing the conductive layer to form a contact plug, removing the doped layer to form an air gap adjacent to the contact plug, and then forming a stop layer on the ILD layer and the contact plug.

According to another aspect of the present invention, a semiconductor device includes a gate structure on a substrate, a source/drain region adjacent to the gate structure, an interlayer dielectric (ILD) layer around the gate structure, a contact plug in the ILD layer and adjacent to the gate structure, an air gap around the contact plug, and a stop layer on the ILD layer and the contact plug.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
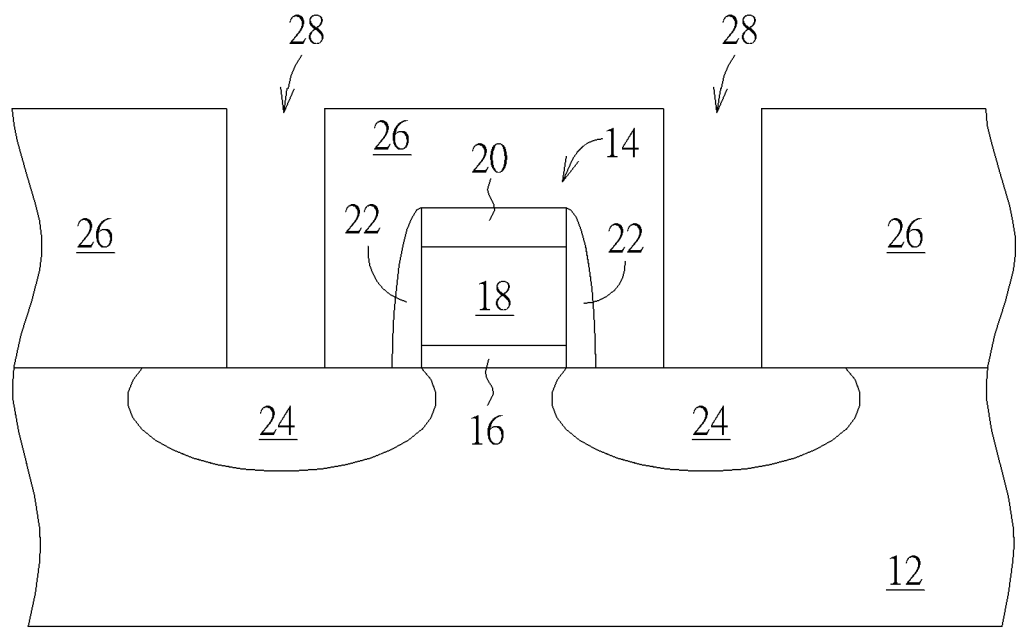
FIGS. 1-6 illustrate a method for fabricating semiconductor device according to an embodiment of the present invention.

Referring to FIGS. 1-6, FIGS. 1-6 illustrate a method for fabricating semiconductor device according to an embodiment of the present invention. As shown in FIG. 1, a substrate 12 is first provided, in which the substrate could be a silicon substrate or silicon-on-insulator (SOI) substrate. A transistor region, such as a PMOS region or a NMOS region could be defined on the substrate 12 and one or more shallow trench isolation (STI) made of silicon oxide could be formed in the substrate 12 for electrical isolation. It should be noted that even though the present invention pertains to a method for fabricating planar field effect transistor (FET), according to other embodiment of the present invention, the following process could also be employed for fabricating non-planar devices such as fin field effect transistor (FinFET) device. In this instance, the substrate 12 shown in FIG. 1 would then be fin-shaped structures disposed on the substrate 12.

According to an embodiment of the present invention, the fin-shaped structures could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures could also be obtained by first forming a patterned mask (not shown) on the substrate, 12, and through an etching process, the pattern of the patterned mask is transferred to the substrate 12 to form the fin-shaped structure. Moreover, the formation of the fin-shaped structures could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures. These approaches for forming fin-shaped structures are all within the scope of the present invention.

Next, at least a gate structures 14 or dummy gate is formed on the substrate 12. In this embodiment, the formation of the gate structure 14 could be accomplished by a gate first process, a high-k first approach from gate last process, or a high-k last approach from gate last process. Since this embodiment pertains to a high-k first approach, a gate dielectric layer 16 or interfacial layer, a gate material layer 18 made of polysilicon, and a selective hard mask 20 could be formed sequentially on the substrate 12, and a pattern transfer process is then conducted by using a patterned resist (not shown) as mask to remove part of the hard mask 20, part of the gate material layer 18, and part of the gate dielectric layer 16 through single or multiple etching processes. After stripping the patterned resist, a gate structure 14 made of a patterned gate dielectric layer 16, a patterned gate material layer 18, and a patterned hard mask 20 is formed on the substrate 12.

Next, at least a spacer 22 is formed on the sidewalls of the gate structure 14 and a lightly doped drain (LDD) 24 is formed in the substrate 12 adjacent to two sides of the spacer 22. In this embodiment, the spacer 22 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The LDD 24 could include n-type dopants or p-type dopants depending on the type of device being fabricated.

Next, a selective contact etch stop layer (CESL) (not shown) could be formed on the substrate 12 surface and the gate structure 14 and an interlayer dielectric (ILD) layer 26 is formed on the gate structure 14 afterwards. Next, a photo-etching process is conducted by using a patterned mask (not shown) as mask to remove part of the ILD layer 26 for forming contact holes 28 exposing the LDD 24.

Figure 2:
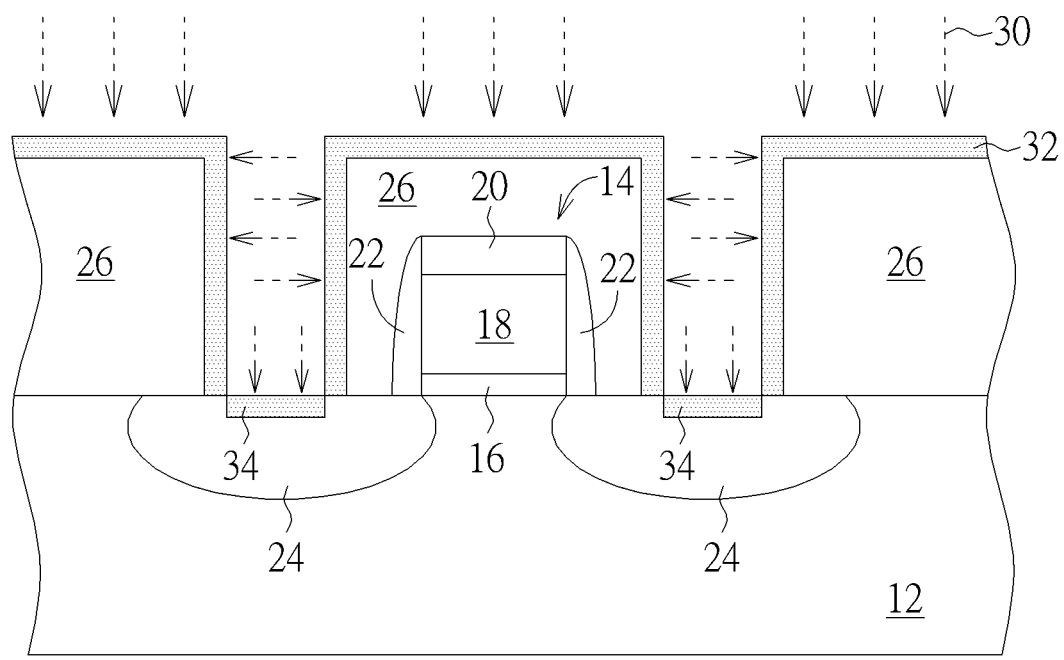

Next, as shown in FIG. 2, a plasma doping process 30 is conducted to form a doped layer 32 in the ILD layer 26 and a source/drain region 34 adjacent to the gate structure 14. Specifically, the plasma doping process 30 conducted at this stage not only implants dopants into the ILD layer 26 adjacent to two sides of the contact holes 28 isotropically but also implants dopants into the substrate 12 directly under the contact holes 28 to form a source/drain region 34 at the same time. Since the dopants are implanted into the ILD layer 26 isotropically, the thickness of the doped layer 32 on the top surface of the ILD layer 26 is substantially equal to the thickness of the doped layer 32 on sidewalls of the ILD layer 26 and the depth of the source/drain region 34 in the substrate 12. The overall width of the source/drain region 34 adjacent to one side of the gate structure 14 in the substrate 12 on the other hand is equal to the width of each of the contact holes 28.

It should be noted that even though only a plasma doping process 30 is conducted to form a doped layer 32 with even thickness in the ILD layer 26, according to other embodiment of the present invention, it would also be desirable to conduct one or more regular ion implantation processes for replacing the aforementioned plasma doping process 30, in which the regular ion implantation processes could be carried out with a vertical angle ion implantation process and a tilt angle ion implantation process for forming the doped layer 32 having same thickness on top surface and sidewalls of the ILD layer 26 and at the same time form a source/drain region 34 in the substrate 12 directly under the contact holes 28, which is also within the scope of the present invention.

Figure 3:
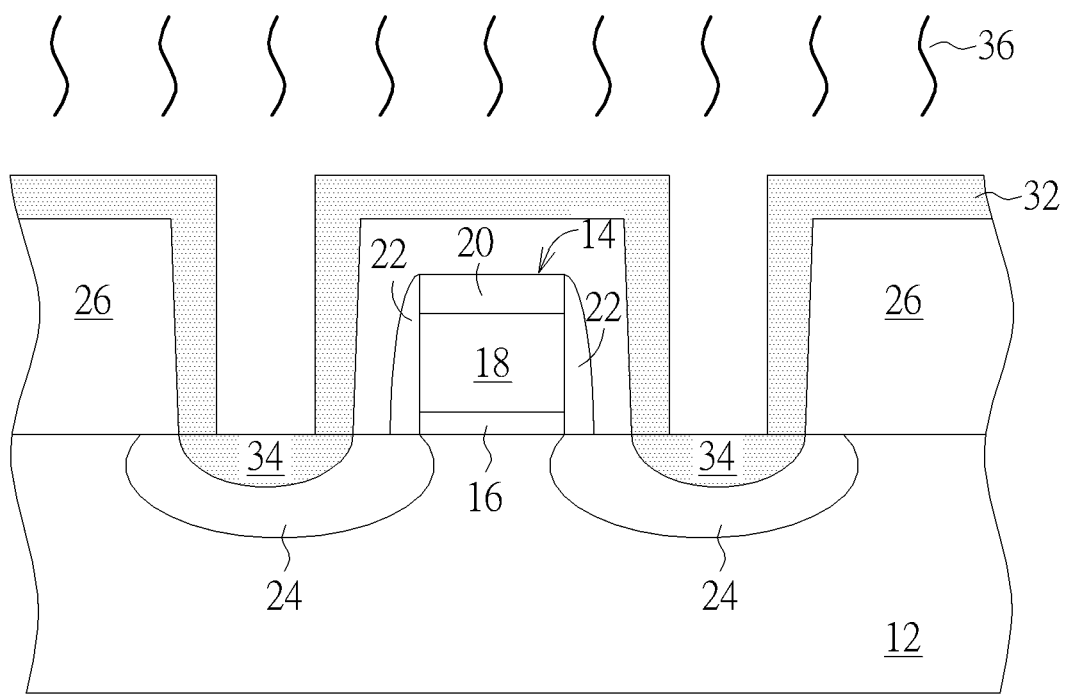

Next, as shown in FIG. 3, a thermal anneal process 36 process is conducted to slightly diffuse the implanted dopants into the ILD layer 26 and the substrate 12. Specifically, the overall thickness of the doped layer 32 after the thermal anneal process 36 at this stage is slightly increased compare to the one shown in FIG. 2 and the overall width of the source/drain region 34 is also extended slightly so that the two sidewalls of the source/drain region 34 at this stage is preferably aligned to outer sidewalls of the doped layer 32.

Figure 4:
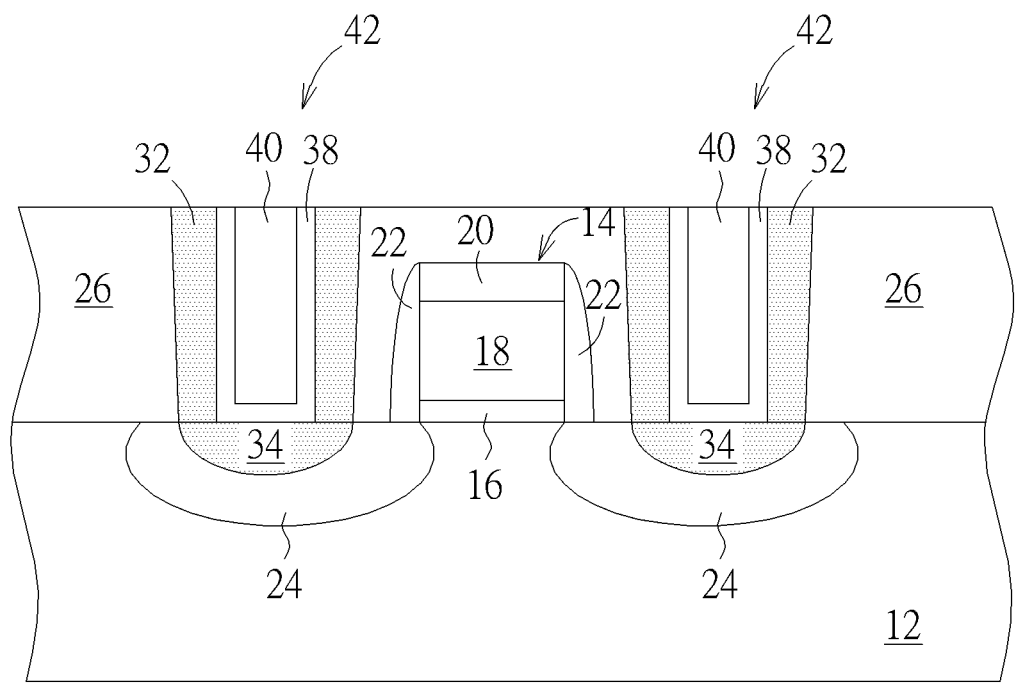

Next, as shown in FIG. 4, conductive materials or a conductive layer including a barrier layer 38 selected from the group consisting of titanium (Ti), titanium nitride (TiN), tantalum (Ta), and tantalum nitride (TaN) and a metal layer 40 selected from the group consisting of tungsten (W), copper (Cu), aluminum (Al), titanium aluminide (TiAl), and cobalt tungsten phosphide (CoWP) are deposited into the contact holes 28, and a planarizing process such as chemical mechanical polishing (CMP) is conducted to remove part of aforementioned barrier layer 38 and metal layer 40 for forming contact plugs 42 electrically connecting the source/drain region 34.

It should be noted that even though the contact plugs 42 in this embodiment are formed to contact the source/drain region 34 directly, according to other embodiment of the present invention, part of the barrier layer 38 could also react with the surface of the substrate 12 to form silicide (not shown) during formation of the contact plugs 42, which is also within the scope of the present invention.

Figure 5:
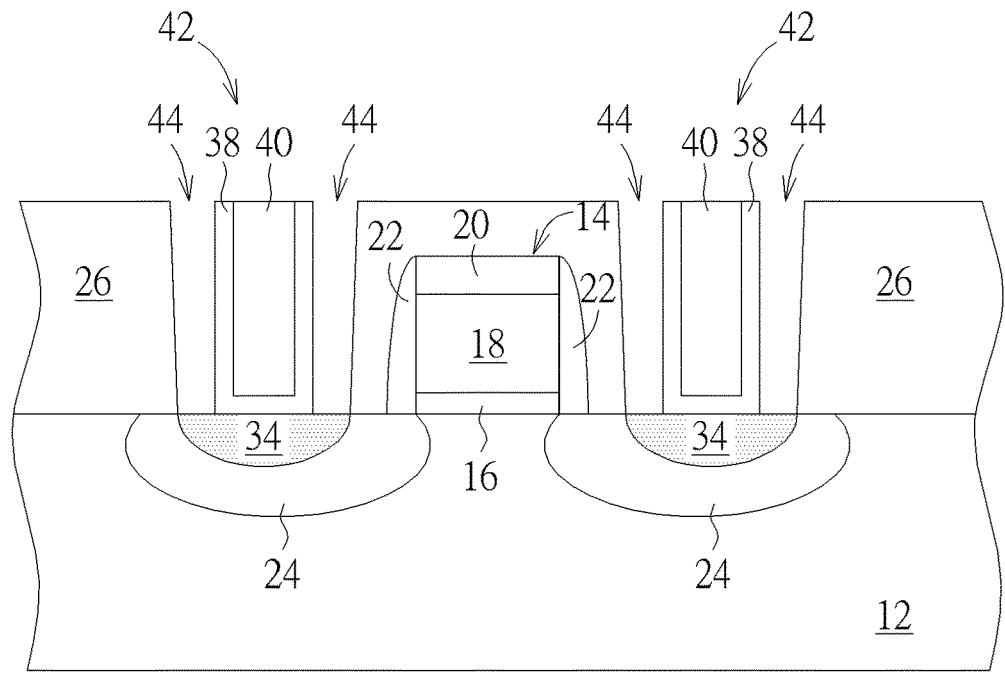

Next, as shown in FIG. 5, an etching process such as a wet etching process could be conducted with or without forming any patterned mask by using diluted hydrofluoric acid (dHF) as etchant to remove all of the doped layer 32 between the contact plugs 42 and the ILD layer 26 for forming air gaps 44 around the contact plugs 42 and exposing the surface of the source/drain region 34. It should be noted that since no patterned mask is formed in this embodiment, the etching process is preferably conducted by using the selectivity between the doped layer 32 having dopants and adjacent contact plugs 42 and ILD layer 26 having no dopants for removing the doped layer 32 completely.

Figure 6:
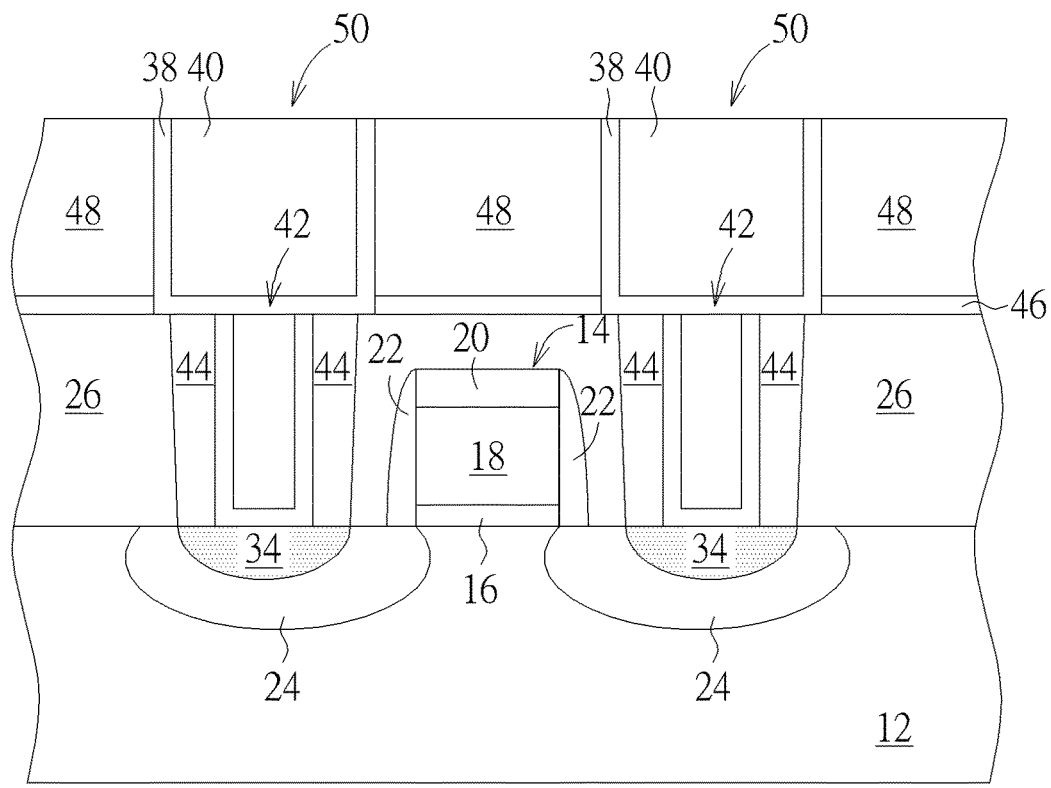

Next, as shown in FIG. 6, a stop layer 46 is formed on the ILD layer 26 to seal off the air gap 44 formed previously, an inter-metal dielectric (IMD) layer 48 is formed on the stop layer 46, and a photo-etching process is conducted to remove part of the IMD layer 48 and part of the stop layer 46 to form openings (not shown) revealing the air gaps 44 once more as well as the top surface of the contact plugs 42. Next, conductive materials including a barrier layer 38 selected from the group consisting of titanium (Ti), titanium nitride (TiN), tantalum (Ta), and tantalum nitride (TaN) and a metal layer 40 selected from the group consisting of tungsten (W), copper (Cu), aluminum (Al), titanium aluminide (TiAl), and cobalt tungsten phosphide (CoWP) are deposited into the openings, and a planarizing process such as chemical mechanical polishing (CMP) is conducted to remove part of aforementioned barrier layer 38 and metal layer 40 for forming metal interconnections 50 electrically connecting the contact plugs 42 underneath. This completes the fabrication of a semiconductor device according to an embodiment of the present invention.

Referring again to FIG. 6, which further illustrates a structural view of a semiconductor device according to an embodiment of the present invention. As shown in FIG. 6, the semiconductor device includes at least a gate structure 14 disposed on the substrate 12, a source/drain region 34 adjacent to the gate structure 14, an ILD layer 26 around the gate structure 14, at least a contact plug 42 in the ILD layer 26 adjacent to the gate structure 14, an air gap 44 around the contact plug 42, a stop layer 46 and IMD layer 48 disposed on the ILD layer 26, and a metal interconnection 50 in the stop layer 46 and IMD layer 48 and on top of the contact plug 42 and the air gap 44.

Viewing from a more detailed perspective, the air gap 44 preferably exposes the source/drain region 44, the sidewall of the ILD layer 26, and the sidewall of the contact plug 42 or each of the air gaps 44 is surrounded by the source/drain region 34, the ILD layer 26, the metal interconnection 50, and the contact plug 42. The top surface of the air gap 44 is even with the top surface of the contact plug 42 and the bottom surface of the air gap 44 is even with the bottom surface of the contact plug 42. It should be noted that even though the metal interconnection 50 is not filled into the air gap 44 underneath, according to other embodiment of the present invention, conductive layer including the barrier layer 38 and metal layer 40 could also be filled into part of the air gap 44 during formation of the metal interconnection 50 so that the bottom surface of the metal interconnection 50 could be slightly lower than the top surface of the ILD layer 26 and the contact plug 42, which is also within the scope of the present invention.

It should be noted that even though a gate structure made of polysilicon is disclosed in this embodiment, according to other embodiment of the present invention, it would also be desirable to conduct a replacement metal gate (RMG) process to transform the gate structure 14 into metal gate after forming the ILD layer 26 and before forming the conduct plugs 42. For instance, the RMG process could be accomplished by first performing a selective dry etching or wet etching process using etchants including but not limited to for example ammonium hydroxide ($NH_4OH$) or tetramethylammonium hydroxide (TMAH) to remove the hard mask 20, the gate material layer 18, and even the gate dielectric layer 16 from gate structure 14 for forming a recess (not shown) in the ILD layer 26. Next, a selective interfacial layer or gate dielectric layer (not shown), a high-k dielectric layer, a work function metal layer, and a low resistance metal layer are formed in the recesses, and a planarizing process such as CMP is conducted to remove part of low resistance metal layer, part of work function metal layer, and part of high-k dielectric layer to form a metal gate. If a high-k last approach were conducted to transform the polysilicon gate structure into metal gate, the metal gate would include an interfacial layer or gate dielectric layer, a U-shape high-k dielectric layer, a U-shape work function metal layer, and a low resistance metal layer.

According to an embodiment of the present invention, the high-k dielectric layer is preferably selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

The work function metal layer is formed for tuning the work function of the metal gate in accordance with the conductivity of the device. For an NMOS transistor, the work function metal layer having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer and the low resistance metal layer may include titanium (Ti), titanium nitride (TiN), tantalum (Ta) or tantalum nitride (TaN). Furthermore, the material of the low-resistance metal layer may include copper (Cu), aluminum (Al), titanium aluminum (TiAl), cobalt tungsten phosphide (CoWP) or any combination thereof. Since the transformation of dummy gates into metal gates through RMG process is well known to those skilled in the art, the details of which are not explained herein for the sake of brevity.

Overall, the present invention first forms an ILD layer on a gate structure, forms contact holes in the ILD layer adjacent to the gate structure, performs a plasma doping process to form a doped layer in the ILD layer and a source/drain region adjacent to the gate structure, forms a conductive layer including a barrier layer and a metal layer in the contact holes, planarizes the conductive layer to form a contact plug, removes the doped layer to form an air gap adjacent to the contact plugs, and then forms a stop layer and IMD layer on the contact plugs to seal off the air gap. By using this approach to form air gap around the contact plugs, the present invention is able to improve issues such as RC delay significantly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a gate structure on a substrate;
    a source/drain region adjacent to the gate structure;
    an interlayer dielectric (ILD) layer around the gate structure;
    a contact plug in the ILD layer and adjacent to the gate structure;
    an air gap around the contact plug;
    a stop layer on the ILD layer and the contact plug; and
    a metal interconnection on and overlapping the contact plug and the air gap.

2. The semiconductor device of claim 1, further comprising:
    a lightly doped drain (LDD) adjacent to the gate structure; and
    a spacer adjacent to the gate structure.

3. The semiconductor device of claim 1, wherein the air gap exposes the source/drain region, the ILD layer, and the contact plug.

4. The semiconductor device of claim 1, wherein top surfaces of the air gap and the contact plug are coplanar.

5. The semiconductor device of claim 1, wherein bottom surfaces of the air gap and the contact plug are coplanar.

* * * * *